(12) United States Patent
Li et al.

(10) Patent No.: US 10,209,316 B2
(45) Date of Patent: Feb. 19, 2019

(54) DYNAMIC RECHARGEABLE BATTERY CAPACITY MONITOR

(71) Applicant: TEXAS INSTRUMENTS INCORPORATED, Dallas, TX (US)

(72) Inventors: Falong Li, Shanghai (CN); Sihua Wen, Shanghai (CN)

(73) Assignee: Texas Instruments Incorporated, Dallas, TX (US)

( * ) Notice: Subject to any disclaimer, the term of this patent is extended or adjusted under 35 U.S.C. 154(b) by 500 days.

(21) Appl. No.: 14/635,187

(22) Filed: Mar. 2, 2015

(65) Prior Publication Data

US 2016/0116544 A1    Apr. 28, 2016

Related U.S. Application Data

(63) Continuation of application No. PCT/CN2014/089424, filed on Oct. 24, 2014.

(51) Int. Cl.
| | |
|---|---|
| *H01M 10/44* | (2006.01) |
| *H01M 10/46* | (2006.01) |
| *G01R 31/36* | (2006.01) |

(52) U.S. Cl.
CPC ..... *G01R 31/3655* (2013.01); *G01R 31/3624* (2013.01); *G01R 31/3651* (2013.01); *G01R 31/3675* (2013.01); *G01R 31/361* (2013.01)

(58) Field of Classification Search
CPC .......... H02J 7/0047; H02J 7/0021; H02J 2007/0049; G01R 31/361; G01R 31/3624; G01R 31/3634
USPC ......... 320/107, 132, 149; 324/426, 437, 433
See application file for complete search history.

(56) References Cited

U.S. PATENT DOCUMENTS

| | | | |
|---|---|---|---|
| 2001/0022518 A1* | 9/2001 | Asakura | G01R 31/3679 324/426 |
| 2008/0112509 A1 | 9/2008 | Ho et al. | |
| 2012/0049802 A1 | 3/2012 | Barsukov et al. | |

(Continued)

FOREIGN PATENT DOCUMENTS

| | | |
|---|---|---|
| CN | 102207541 A | 10/2011 |
| CN | 102262216 A | 11/2011 |
| CN | 103135056 A | 6/2013 |

(Continued)

OTHER PUBLICATIONS

PCT Search Report for cited in corresponding PCT Publication No. PCT/US15/24559, dated Jun. 18, 2015 (2 pages).

(Continued)

*Primary Examiner* — Edward Tso
(74) *Attorney, Agent, or Firm* — William B. Kempler; Charles A. Brill; Frank D. Cimino

(57) ABSTRACT

A method for dynamically monitoring a capacity of a battery includes estimating a first voltage threshold of the battery that is being discharged, wherein the first voltage threshold corresponds to a low capacity of the battery, and measuring a present voltage and a present current of the discharging battery. The method further includes re-scaling the present current based on the estimated first voltage threshold and the measured present voltage of the discharging battery, and calculating, based on re-scaling the measured present current, the battery's capacity before the present voltage level decreases below the first voltage threshold.

18 Claims, 2 Drawing Sheets

(56) References Cited

U.S. PATENT DOCUMENTS

2012/0133331 A1   5/2012  Ling et al.
2014/0152317 A1*  6/2014  Baraszu ............... G01N 27/416
                                                    324/433

FOREIGN PATENT DOCUMENTS

DE    102004056190 A1    5/2006
EP         1562048 A1    8/2005

OTHER PUBLICATIONS

Supplementary European Search Report, dated May 15, 2018 (1 page).

* cited by examiner

DYNAMIC RECHARGEABLE BATTERY CAPACITY MONITOR

CROSS-REFERENCE TO RELATED APPLICATION

This is a continuation of copending International Application No. PCT/CN2014/089424, with an international filing date of Oct. 24, 2014, which designated the United States and is hereby fully incorporated herein by reference for all purposes.

BACKGROUND

Batteries are commonly used as power sources for portable electric devices, such as a mobile phones, laptop computers, tablets, etc. In general, a battery contains a limited capacity, which means that the battery is capable of supplying power for a limited amount of time before the battery needs to be recharged (in the case of rechargeable batteries). Battery monitors are used to monitor the remaining capacity of the battery in order to provide feedback to the operator of the battery-operated device as to how much useful battery life remains for the device.

SUMMARY

Systems and methods to monitor a battery's electric capacity by implementing a current rescale module are disclosed herein. In an embodiment, a method for dynamically monitoring a capacity of a battery includes estimating a first voltage threshold of the battery that is being discharged, wherein the first voltage threshold corresponds to a low capacity of the battery, and measuring a present voltage and a present current of the discharging battery. The method further includes re-scaling the present current based on the estimated first voltage threshold and the measured present voltage of the discharging battery, and calculating, based on re-scaling the measured present current, the battery's capacity before the present voltage level decreases below the first voltage threshold.

In another embodiment, an apparatus to determine a capacity of a battery includes a measurement unit to be coupled to the battery and configured to measure voltage and current levels of the battery at first periodic intervals and to save the measured voltage and current levels in a storage unit and a computing resource coupled to the measurement unit. More specifically, the computing resource is configured to estimate a first voltage threshold of the battery at each periodic interval, wherein the first voltage threshold corresponds to a low capacity of the battery, compare a present voltage level with a second voltage threshold, and compare a difference value between the present voltage level and the first voltage threshold with a third voltage threshold. If the present voltage level is less than the second voltage threshold and the difference value is less than the third voltage threshold, the computing resource is to calculate a voltage dropping rate of the battery. Further, the computing resource is configured to, based on the calculated voltage dropping rate of the battery, compute an amount of time to discharge the battery from the present voltage level to the first threshold voltage, based on the computed amount of time, compute a scale factor to re-scale a present current level, and estimate a re-scaled state of the battery's capacity based on the computed scale factor.

Yet in another embodiment, a method includes measuring voltage and current levels of the battery every second, estimating a first voltage threshold of the battery every second, wherein the first voltage threshold corresponds to a low capacity of the battery, and comparing a measured voltage level with a second voltage threshold, and a comparing a difference value between the measured voltage level and the first voltage threshold with a third voltage threshold. If both the measured voltage level is less than the second voltage threshold and the difference value is less than the third voltage threshold, the method includes calculating a voltage dropping rate of the battery based on previously measured voltages. Moreover, the method includes based on the voltage dropping rate of the battery, computing an amount of time to discharge the battery from the present voltage level to the first threshold voltage, and based on the computed amount of time, computing a scale factor to re-scale a measured current level so as to estimate a re-scaled state of the battery's capacity.

BRIEF DESCRIPTION OF THE DRAWINGS

For a detailed description of exemplary embodiments of the invention, reference will now be made to the accompanying drawings in which.

NOTATION AND NOMENCLATURE

Figure 1:
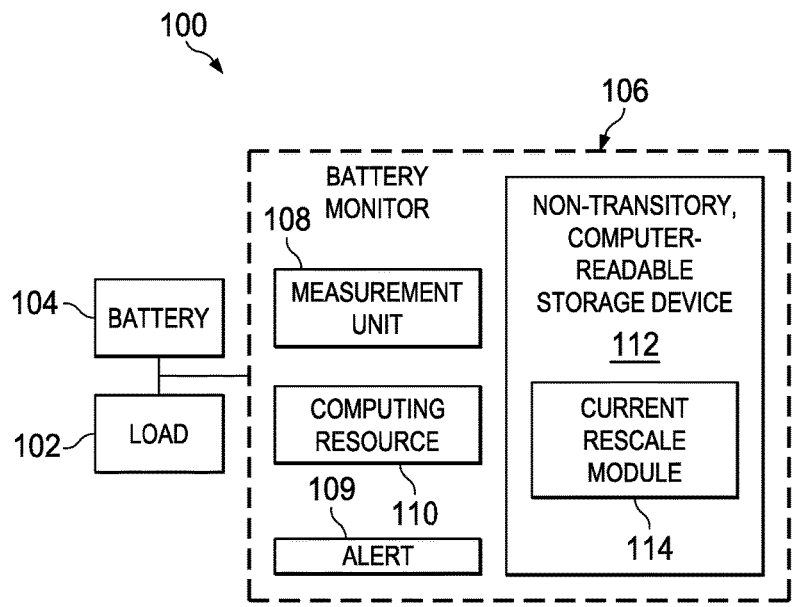
FIG. 1 shows a block diagram to illustrate a battery monitor coupled to a battery in accordance with various embodiments.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

In the use of battery-powered equipment, such as smartphones, electric vehicles, etc., it is desirable to monitor the battery in order to provide a prediction informing users of a remaining capacity of the battery. In general, the remaining capacity prediction of a battery may be based on the state of charge for the battery.

The state of charge (SOC) for a battery is a characterization of the percentage of remaining energy, or capacity, available from the battery. The units of SOC may be percentage points (0% designating a fully drained battery; 100% designating a fully charged battery). Generally, SOC cannot be measured directly, but it can be estimated by measuring variables of the battery, such as current, voltage, and chemical values. More particularly, measuring the current flowing through the battery is also known as "Coulomb counting" (or "charge counting"). Coulomb counting involves calculating the SOC by measuring the battery current and integrating the measured current over time.

In addition to calculating the SOC based on the measured current, a battery monitor also may measure battery voltage and environmental conditions (e.g., ambient temperature) in which the battery operates and incorporates such measured variables (e.g., voltage and temperature) to further estimate the SOC. Generally, an algorithm is implemented in the battery monitor to use the measured variables for estimating the SOC. More specifically, a battery monitor periodically may measure voltage and current of the battery (e.g., once per second) during the battery's discharge and, in real-time, may calculate one or more reference points (e.g., end of discharge voltage, also known as EDV) corresponding to a certain level of remaining capacity in the battery. That is, the EDV is a voltage that corresponds to the point at which a discharging battery has reached a lower threshold SOC point. For example, in addition to periodically measuring battery voltage and current, the battery monitor also may periodically re-calculate the EDV that is associated with a low percentage threshold of the SOC (e.g., 7%). The EDV voltage is a voltage at which proper operation of the battery-operated device can no longer be guaranteed. Generally, the EDV voltage threshold varies in accordance with various aspects of the operating battery, for example, a loading of the battery and ambient temperature around the battery. While the battery is discharging, the battery's voltage may decrease and thus the SOC (i.e., battery's capacity) decreases as well. As the measured voltage of the battery reaches the EDV level, the battery monitor may respond by, for example, alerting the user that the battery's capacity has decreased to a level at which proper device operation can no longer be guaranteed. The SOC associated with the EDV point may be, for example, 7%.

However, in some battery monitors, the battery monitor may be subject to a discontinuous drop of the calculated SOC as the measured voltage reaches the EDV. In some embodiments, this discontinuous drop of the calculated SOC may be due to a lack of real-time updated full charge capacity (FCC) of the battery that may change with the battery's loading and ambient temperature. The FCC of a battery may be measured in units of, for example, milliamp hours (mAh), and generally is the maximum value of how much energy a battery is able to discharge. The FCC of a given battery may vary with the battery's loading, ambient temperature, the battery's age, etc. For example, when the battery is coupled to a heavy loading (i.e., operable to drive a heavy load) and/or operates in a low ambient temperature environment, the FCC of the battery may be lower than in other conditions (lighter loading and/or higher temperatures), and the battery monitor may not update or be provided with an updated FCC value.

In accordance with the disclosed embodiments, a battery monitor is disclosed herein that automatically rescales the measured current. By integrating the re-scaled current over time, an adjusted remaining capacity of the battery may be calculated by the disclosed battery monitor to estimate the SOC more accurately. As such, the disclosed battery monitor may avoid the discontinuous drop of the SOC. In other words, when the measured voltage of the discharging battery decreases to the EDV, the reported SOC (calculated via the re-scaled current) conforms to the referenced SOC (e.g., 7%) corresponding to the EDV. The disclosed embodiments to monitor the battery may be limited in electronic device, as well as other types of device that include a battery to be monitored.

FIG. 1 shows a block diagram of a system 100 to illustrate the disclosed battery monitor 106 in accordance with various embodiments. The system 100 includes a battery 104, a load 102, and a battery monitor 106. The load 102 coupled to the battery 104 may be a circuit (discrete circuit, integrated circuit, etc.) that performs any type of function or any other type of load. The battery monitor 106 is coupled to the battery 104. The battery monitor 106 may include a measurement unit 108, a computing resource 110, and a non-transitory, computer-readable storage device 112. The non-transitory, computer-readable storage device 112 may further include a current rescale module 114 which comprises machine instructions that are executable by the computing resource.

In some embodiments, the non-transitory, computer-readable storage device 112 may be implemented as volatile storage (e.g., random access memory), non-volatile storage (e.g., hard disk drive, optical storage, solid-state storage, etc.) or combinations of various types of volatile and/or non-volatile storage. The computing resource 110 is a hardware device and may include one or more processors, one or more computers, or any other type of computing resource to execute the current rescale module 114.

As a result of executing the current rescale module 114, the measurement unit 108 is to measure in real-time signal including the voltage and/or current of the battery 104 as well as other characteristics such as ambient temperature. Even though the battery monitor 106 as shown in FIG. 1 includes the computing resource 110, the storage device 112 and the measurement unit 108 as distinct components, in other embodiments, the computing resource 110, the storage device 112 and the measurement unit 108 may be part of the same component.

Figure 2:
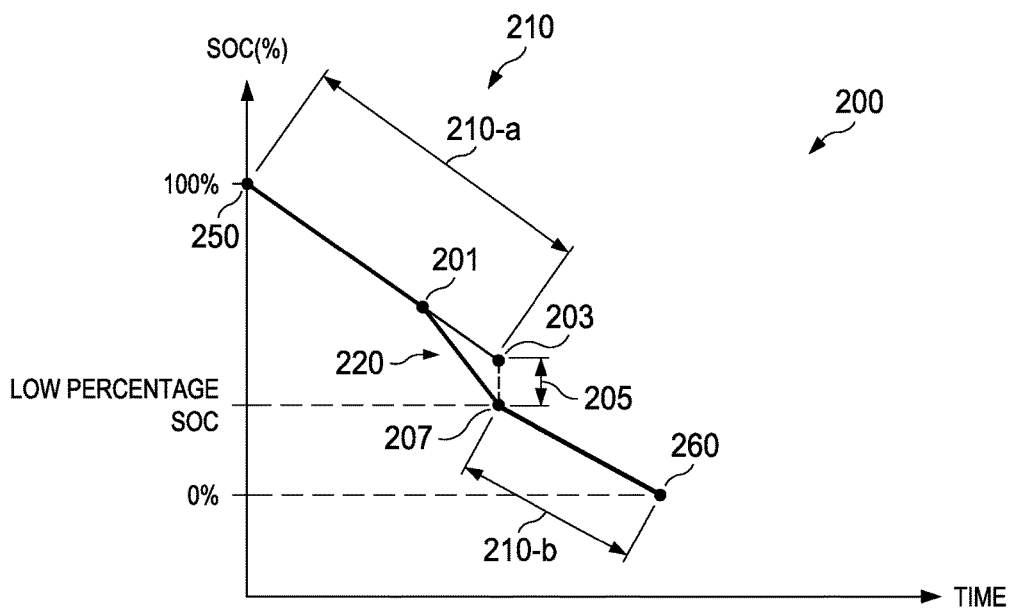
FIG. 2 shows an example to compare state of charges (SOCs) calculated by two methods in accordance with various embodiments.

FIG. 2 shows a diagram 200 comparing two curves of SOCs 210 and 220 estimated respectively by conventional and the disclosed battery monitor 106. That is, curve 210 is estimated by a conventional battery monitor and curve 220 results from the disclosed battery monitor 106 The diagram 200 includes an X-axis representing "time," and a Y-axis representing SOC of a discharging battery (e.g., battery 104). In accordance with various embodiments, the unit of SOC (Y-axis) is % and the unit of time (X-axis) may be minutes. Continuing with the above example in which the battery discharges with heavy loading, the curve 210 of a conventional battery monitor illustrates the discrepancy between the reported SOC and the reference SOC. The curve 220 shows the SOC estimated by the disclosed battery monitor 106.

As shown in FIG. 2, the curve 210 of a conventional battery monitor includes a first segment 210-a, a discontinuous drop of SOC (identified at 205), and a second segment 210-b. More specifically, the first segment 210-a starts at point 250 and ends at point 203. The point 250 is generally referred to as 100% SOC, which means the battery is fully charged. The point 203, where the discontinuous drop occurs, generally corresponds to the SOC at which the measured voltage of the battery reaches the EDV. The segment 210-*b* starts at point 207 and ends at point 260 which corresponds to 0% SOC. The point 207 corresponds to an SOC percentage at the EDV point (e.g., 7%). The discontinuous drop occurs because the conventional battery monitor calculates the SOC based on a constant FCC. However, as discussed above, the FCC of a discharging battery changes with various factors including environmental parameters. Thus, when the measured voltage reaches the EDV, the actual SOC may be lower than the SOC calculated by the monitor. For example, at point 203, the actual SOC may be at 7%, but the calculated SOC still shows a much higher value, such as 20%.

Referring still to FIG. 2, the curve 220 generated using the disclosed battery monitor 106 is a relatively smooth curve without the discontinuous drop of SOC at 205 characteristic of the SOC curve 210 resulting from some conventional battery monitors. More specifically, the curve 220 starts to decrease below the curve 210 at point 201. In accordance with illustrative embodiments, the point 201 corresponds to a voltage threshold which is higher than the EDV of the battery. The voltage threshold may be a preset parameter defined in the current rescale module 114. In accordance with current embodiments, the voltage threshold of point 201 is selected to avoid the discontinuous drop 205 before the voltage of the discharging battery decreases to the EDV since frequently, the discontinuous drop 205 occurs when the voltage approaches or reaches the EDV. From the points 250 to 201 in the curve 220, the disclosed batter monitor may calculate may calculate the SOC by integrating the measured battery current.

Starting from the point 201, the curve 220 of the disclosed battery monitor 106 diverges from the curve 210 of conventional battery monitors. While conventional battery monitors may continue to integrate the measured battery current, the disclosed battery monitor 106 re-scales the measured current and integrates the re-scaled current. The re-scaled current is based on estimating, by the disclosed battery monitor 106, an amount of time that the battery needs to discharge from a present measured voltage to the EDV. Through estimating the amount of time, a more accurate remaining capacity (i.e., SOC) of the battery may be produced without the battery monitor updating the FCC that changes with the battery's loading and the ambient temperature. The re-scaled current may be computed by the current rescale module 114 upon execution by the computing resource 110. Details of integrating the re-scaled current to produce the SOC (e.g., curve 220) will be explained with respect to the flow chart in FIG. 3.

Figure 3:
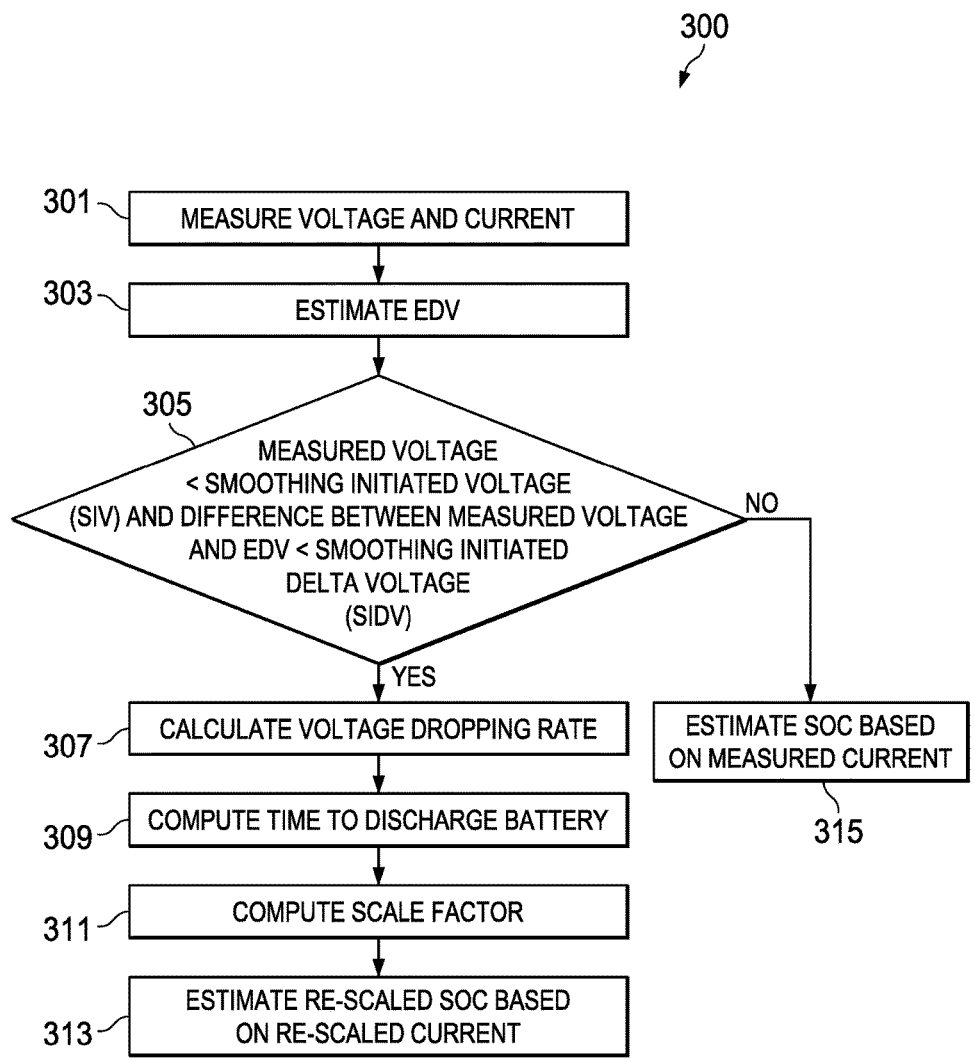
FIG. 3 shows a flow chart to implement a current rescale module of a battery monitor in accordance with various embodiments.

FIG. 3 shows a flow chart 300 to illustrate a method of implementing the disclosed battery monitor 106 in accordance with various embodiments. The operations shown in FIG. 3 may be performed in the order shown, or in a different order. Further, the operations may be performed sequentially, or two or more of the operations may be performed in parallel.

The method may be implemented as a result of the computing resource 110 of the battery monitor 106 executing the current rescale module 114. The method starts with block 301 at which the measurement unit 108 of the battery monitor 106 measures the voltage and current of the discharging battery 104. In block 301, after the computing resource 110 executes the current rescale module 114, the computing resource 110 may request the measurement unit 108 to start measuring voltages and currents of the battery 104 and retrieves the measured voltage and currents from the measurement unit 108. According to an illustrative embodiment, the measurement unit 108 may be configured to periodically measure the voltage and current (e.g., once per second).

The method continues at block 303 with periodically (e.g., once per second) estimating EDV of the battery 104. As described above, the EDV of the battery may vary with the load 102 and/or the ambient temperature around the battery 104. Thus, while periodically measuring the voltage and current of the discharging battery 104, the battery monitor 106 also estimates the EDV in accordance with changing environment parameter, such as, a heavy or light load 104 and the ambient temperature.

Subsequently, the method continues at block 305 with, at a present time "t," comparing the voltage measured in block 301 with a smoothing initiated voltage (SIV), and comparing a difference value between the measured voltage (block 301) and the EDV estimated in block 303 with a smoothing initiated delta voltage (SIDV). The SIV may be the voltage threshold corresponding to the point 201 in FIG. 2. In accordance with various embodiments, the SIV and SIDV may be preset and encoded in the current rescale module 114. More specifically, the SIV may be desirable to be larger than a maximum value of the battery's EDV in order to prevent the discontinuous drop (e.g., 205) of the SOC described with respect to the curve 210 in FIG. 2. Since the EDV varies with environmental parameters (e.g., temperature), a heavy loading and/or low ambient temperature may result in a low EDV. Thus, the SIV may be chosen to be larger than the maximum value of the battery's EDV.

As shown in FIG. 3, if the measured voltage (at time "t") is less than the SIV and the difference value (at time "t") is less than the SIDV, the method routes to block 307 at which a voltage dropping rate of the discharging battery 104 is calculated. A dropping rate is defined as a difference value between the maximum delta voltages of each of the previous two time intervals (e.g., one minute time intervals for this calculation). That is, the voltage dropping rate for the present time period is calculated based on data retrieved from the previous two time intervals. Assuming one minute time intervals and the voltage dropping rate for minute M is to be computed, data from minutes M−1 and M−2 are retrieved. The data retrieved from each of the prior two minutes includes the maximum delta voltage computed during each such minute. The delta voltage is the difference between the measured battery voltage and EDV. That difference may be computed once per second and thus there are 60 such delta voltages during each minute interval. The maximum delta voltage for a given minute is the largest of the calculated delta voltage values for that minute. Minute M−1 has a particular maximum delta voltage and similarly M−2 has its own maximum delta voltage. The difference between the maximum delta voltages from prior minutes M−1 and M−2 is the voltage dropping rate for the current minute M.

Referring still to FIG. 3, after the dropping rate is calculated in block 307, the method advances to block 309 with computing an amount of time (T) to discharge the battery 104 from the present measured voltage (measured at 301) to the EDV estimated at 303. That is, a discharge time is computed from a present delta voltage to a zero delta voltage. In one example, the amount of time (T) is calculated by the battery monitor 106 as the present delta voltage divided by the dropping rate.

The method continues at block 311 with computing a scale factor to re-scale the measured current so that a re-scaled SOC may be obtained by integrating the re-scaled current. In block 311, a delta remaining capacity of the battery 104 may be calculated by the battery monitor 106 as, DeltaSOC×FCC/100%, wherein the DeltaSOC is defined as a difference value between a present SOC and an SOC associated with the EDV. More specifically, the present SOC is calculated by the battery monitor 106 by integrating the present measured current (at time "t"), and the SOC associated with the EDV is the low percentage SOC as shown and described in FIG. 2. Generally, the SOC associated with the EDV is chosen as a low percentage value, such as 7%. After calculating the delta remaining capacity (DeltaRM), an amount of current that is needed to discharge the battery from the present voltage to the EDV may be estimated by the battery monitor 106 as, I=DeltaRM×60/T.

Still referring to block 311, a scale factor (β) is calculated based on the amount of current (I) and the present measured current. In accordance with various embodiments, the scale factor (β) is defined as, I/present measured current. As such, a re-scaled current at the present time "t" may be calculated by the battery monitor 106 as, β×the present measured current.

Using the re-scaled current, the method continues at block 313 with estimating a re-scaled SOC. More particularly, the re-scaled SOC is calculated by integrating the re-scaled current over, for example, one second. As such, at each second after the measured voltage being determined to meet the conditions in block 305, the measured current will be re-scaled, and a re-scaled SOC will be estimated by the battery monitor 106.

Still referring to the flow chart 300, if the measured voltage (at the present time "t") is not less than the SIV or the difference value (at the present time "t") is not less than the SIDV, the method routes to block 315. In block 315, the battery monitor 106 estimates the SOC by integrating the present measured current (without first rescaling the current).

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method for dynamically monitoring a capacity of a rechargeable battery, the rechargeable battery having a discontinuity in a state of charge (SOC) determination during discharge of the battery as the SOC approaches an end of discharge voltage (EDV) of the rechargeable battery, the method comprising:
   determining a first voltage threshold of the battery that is being discharged, wherein the first voltage threshold corresponds to a low capacity of the battery;
   measuring a present voltage and a present current of the discharging battery;
   re-scaling the present current based on the determined first voltage threshold and the measured present voltage of the discharging battery; and
   determining, based on re-scaling the measured present current, the battery's capacity before the present voltage level decreases below the first voltage threshold; and
   alerting a user of a rechargeable battery—powered electronic circuit of the time to end of discharge voltage (EDV) for the battery.

2. The method of claim 1 wherein determining the first voltage threshold is based on a loading of the battery and ambient temperature around the battery.

3. The method of claim 1 further comprising, before the present voltage level decreases below the first voltage threshold, comparing the present voltage level with a second voltage threshold and comparing a difference value between the present voltage level and the first voltage threshold with a third voltage threshold, wherein the second and third voltage thresholds are predefined.

4. The method of claim 3 wherein, if the present voltage level is less than the second voltage threshold and the difference value is less than the third voltage threshold, determining the battery's capacity by integrating the re-scaled present current.

5. The method of claim 3 wherein, if the present voltage level is not less than the second voltage threshold or the difference value is not less than the third voltage threshold, determining the battery's capacity by integrating the measured present current.

6. The method of claim 4 wherein re-scaling the measured current level includes estimating a scale factor to re-scale the present current, wherein the scale factor is based on the amount of current needed to discharge the battery from the present voltage to the first voltage threshold.

7. An electronic apparatus operable from and coupleable to a rechargeable battery, the rechargeable battery having a discontinuity in a state of charge (SOC) determination during discharge of the battery as the SOC approaches an end of discharge voltage (EDV) of the rechargeable battery, the apparatus comprising:
   an alert device alerting a user of the apparatus of time to end of discharge voltage (EDV) for the battery;
   a measurement circuit coupleable to the battery and configured to measure voltage and current levels of the battery at first periodic intervals and to save the measured voltage and current levels in a storage unit; and
   an electronic circuit coupled to the measurement unit and configured to:
      generate a first voltage threshold of the battery at each periodic interval, wherein the first voltage threshold corresponds to a low capacity of the battery;
      compare a present voltage level with a second voltage threshold, and compare a difference value between the present voltage level and the first voltage threshold with a third voltage threshold;
      if the present voltage level is less than the second voltage threshold and the difference value is less than the third voltage threshold, determine a voltage dropping rate of the battery;
      based on the determined voltage dropping rate of the battery, determine an amount of time to reach end of discharge voltage for the battery from the present voltage level to the first threshold voltage; and
      based on the determined amount of time, compute a scale factor to re-scale a present current level;
      determine a re-scaled state of the battery's capacity based on the determined scale factor; and
      activate the alert device alerting the user of the apparatus of the end of discharge voltage (EDV).

8. The apparatus of claim 7 wherein a processor is configured to estimate the first voltage threshold based on a loading of the battery and ambient temperature around the battery.

9. The apparatus of claim 7 wherein the second and third voltage thresholds are predefined.

10. The apparatus of claim 7 wherein, at a second periodic interval, the electronic circuit is to determine the voltage dropping rate based on a difference value between first and second delta voltages, wherein the first delta voltage is a maximum value among a plurality of difference values between measured voltage levels of the battery and first voltage thresholds at each first periodic interval during a previous second periodic interval, and the second delta voltage is a maximum value of a plurality of difference values between measured voltage levels of the battery and first voltage thresholds at each first periodic interval during another previous second periodic interval.

11. The apparatus of claim 7 wherein the electronic circuit is to determine the amount of time to discharge the battery from the present voltage level to the first threshold voltage by dividing the present voltage level of the battery by the determined voltage dropping rate.

12. The apparatus of claim 7 wherein the electronic circuit is to determine the re-scaled state of the battery's capacity by integrating the re-scaled current level over the first periodic time interval.

13. The apparatus of claim 7 wherein if the present voltage level is not less than the second voltage threshold or the difference value is not less than the third voltage threshold, the electronic circuit is to determine a state of the battery's capacity based on a present current level.

14. A method for operating a rechargeable battery-powered electronic circuit, the rechargeable battery having a discontinuity in a state of charge (SOC) determination during discharge of the battery as the SOC approaches an end of discharge voltage (EDV) of the rechargeable battery, the method comprising:
   measuring voltage and current levels of the rechargeable battery at an interval;
   generating a first voltage threshold of the rechargeable battery at the interval, wherein the first voltage threshold corresponds to a low capacity of the rechargeable battery;
   comparing a measured voltage level with a second voltage threshold, and a comparing a difference value between the measured voltage level and the first voltage threshold with a third voltage threshold;
   determining if both the measured voltage level is less than the second voltage threshold and the difference value is less than the third voltage threshold, calculating a voltage dropping rate of the demand rechargeable battery based on previously measured voltages;
   based on the voltage dropping rate of the rechargeable battery, determining an amount of time to discharge the rechargeable battery from the present voltage level to the first threshold voltage;
   based on the computed amount of time, determining a scale factor to re-scale a measured current level so as to determine a re-scaled state of the rechargeable battery's capacity whereby the rechargeable battery's capacity is determined not to be below a level where proper operation of the electronic circuit can be guaranteed; and
   alerting a user of the rechargeable battery—powered electronic circuit of of the time to end of discharge voltage (EDV) for the battery.

15. The method of claim 14 wherein the second and third voltage thresholds are predefined.

16. The method of claim 14 wherein if the present voltage level is not less than the second voltage threshold or the difference value is not less than the third voltage threshold, determining a state of the battery's capacity based on a present current level.

17. The method of claim 14 wherein calculating the voltage dropping rate comprises calculating a difference value of first and second delta voltages, wherein the first delta voltage is a maximum value among a plurality of difference values between voltage levels of the battery and first voltage thresholds measured every second during a previous one-minute interval, and the second delta voltage is a maximum value among a plurality of difference values between voltage levels of the battery and first voltage thresholds measured every second during another one-minute interval.

18. The method of claim 17 wherein the one-minute intervals happen consecutively.

* * * * *